United States Patent [19]
Smith

[11] 3,742,593
[45] July 3, 1973

[54] SEMICONDUCTOR DEVICE WITH POSITIVELY BEVELED JUNCTIONS AND PROCESS FOR ITS MANUFACTURE

[75] Inventor: Curtis R. Smith, Auburn, N.Y.

[73] Assignee: General Electric Company, Syracuse, N.Y.

[22] Filed: Dec. 11, 1970

[21] Appl. No.: 97,125

[52] U.S. Cl. .................................... 29/583, 29/580
[51] Int. Cl. .................................... B01j 17/00
[58] Field of Search .......................... 29/580, 583; 317/235

[56] References Cited

UNITED STATES PATENTS

| | | | |
|---|---|---|---|
| 3,437,886 | 4/1969 | Edqvist et al. | 317/235 |
| 3,559,006 | 1/1971 | Otsuka et al. | 317/235 |

*Primary Examiner*—Charles W. Lanham
*Assistant Examiner*—W. C. Tupman
*Attorney*—Robert J. Mooney, Nathan J. Cornfeld, Carl O. Thomas, Frank L. Neuhauser, Oscar B. Waddell and Joseph B. Forman

[57] ABSTRACT

A semiconductive element is disclosed having forward and reverse voltage blocking junctions which are positively beveled. One beveled edge surface of the semiconductive element lies entirely inwardly of the tangential projection of the remaining beveled edge surface. Beveling is accomplished by forming a single beveled edge surface across both junctions and thereafter relieving an edge portion of the semiconductive element adjacent the negatively beveled junction to form a second beveled edge surface which is positively beveled.

4 Claims, 3 Drawing Figures

INVENTOR:
CURTIS R. SMITH,

BY Carl O. Thomas
HIS ATTORNEY.

SEMICONDUCTOR DEVICE WITH POSITIVELY BEVELED JUNCTIONS AND PROCESS FOR ITS MANUFACTURE

My invention relates to an improved semiconductor device having at least two positively beveled junctions and to a process for its manufacture.

An extensive discussion of the voltage blocking improvements to be realized by beveling the edge surfaces of semiconductive elements is set forth in Huth et al. U.S. Pat. No. 3,491,272, issued Jan. 20, 1970, the disclosure of which is here incorporated by reference. Huth and Davies were first in the art to distinguish positively and negatively beveled junctions. Huth et al defines a positively beveled junction as one which is peripherally traversed by a beveled edge surface oriented so that the layer adjacent the junction having the higher resistivity has the smaller cross-sectional area measured in a plane parallel to the junction. The voltage blocking characteristic of a positively beveled junction improves progressively as the intersection of the edge with the junction declines from normality. For negatively beveled junctions—that is, those junctions which are intersected by an edge surface about their periphery so that the layer of higher resistivity exhibits the larger cross-sectional area in a plane parallel to the junction—blocking improvements are noted only for very limited ranges of acute bevel angles.

In Huth et al. patent application Ser. No. 812,492, filed Oct. 31, 1968, a division of the above noted Huth et al patent, a semiconductive element is disclosed and claimed which is provided with at least two parallel junctions separated by an intervening layer of comparatively higher resistivity than the remaining layers associated with the junctions. Both the junctions are positively beveled.

Figure 1:
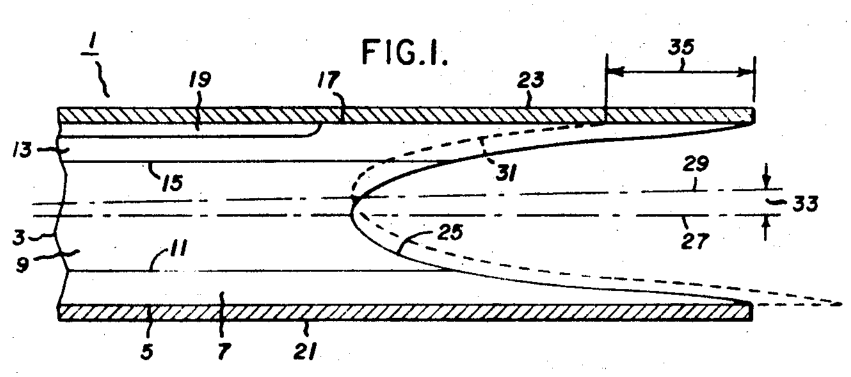

The applicability of the Huth et al. double positively beveled (or pulley wheel) semiconductive element configuration as applied to a thyristor structure may be best appreciated by reference to FIG. 1, in which a portion of a thyristor 1 is illustrated comprised of a semiconductive element 3. The semiconductive element has located adjacent a first major surface 5 a first layer 7, which is typically of P conductivity type. Adjacent the first layer is located a second layer 9, which is typically of N conductivity type and which exhibits a resistivity exceeding that of the first layer. The first and second layers form a junction 11 therebetween. In its most common form the junction 11 is substantially parallel to the first major surface. A third layer 13 is located adjacent the second layer and remote from the first layer. The third layer is of like conductivity type as the first layer and also exhibits a resistivity lower than that of the second layer. The third layer forms a junction 15 with the second layer which is typically substantially parallel to the first major surface. The third layer typically, but not necessarily, extends to the second major surface 17 of the semiconductive element. Preempting a portion of the third layer adjacent the second major surface is a fourth layer 19 which may be formed in the third layer by diffusion or alloying techniques. The fourth layer is of like conductivity type as the second layer, but is of much lower resistivity. The junction the fourth layer forms with the third is not normally relied upon for its voltage blocking characteristics and, hence, requires no particular explanation, being a conventional feature. A first major current carrying electrode 21 is ohmically associated with a major portion, if not all, the first layer adjacent the first major surface. A second major electrode 23 typically lies in ohmic contact with the fourth layer and also with a portion of the third layer adjacent the second major surface to provide thermal stability and dv/dt protection for the device as taught by Aldrich et al. U.S. Pat. No. 3,476,993, issued Nov. 4, 1969. A gate electrode is usually also associated with the third layer adjacent the second major surface in a conventional manner; however, this feature, not being pertinent to voltage blocking characteristics, is not shown.

The beveled edge 25 of the semiconductive element extends around the entire periphery thereof and forms an acute positive bevel angle with respect to both the first and second junctions. It can be seen that the edge surface as shown is approximately parabolic in cross-section along the edge shown, with the axis 27 of the parabola lying substantially parallel to the first and second junctions and located centrally of the second layer.

The thyristor 1 is capable of blocking forwardly and reversely applied voltages of high magnitude because of the positive beveling of the first and second junctions. Nevertheless, thyristors of this general configuration have not to date found their way into commercial use. This is attributable to the difficulties that are encountered in manufacturing such structures in a replicable manner to commercially attactive yields of useable devices. The near asymptotic approach of the beveled edge 25 to the major surfaces results in quite fragile edges for the semiconductive element that render it difficult to handle for further processing. Frequently a portion of the attenuated edges break off even while the bevel surface is being formed. The resulting asymmetry of the element renders it inconvenient to index in subsequent mounting. The beveled edge 25 is formed according to one known technique by rotating the semiconductive element about a central axis while impinging fluid borne abrasive particles against the edge surface of the element. In order to achieve the structure shown it is necessary that the fluid jet be quite accurately aligned. For example, if the axis of the fluid jet is skewed somewhat, as illustrated by the center line 29, an edge bevel configuration 31, shown in dashed outline, will result rather than the bevel edge 25 desired. This steepens the bevel adjacent one junction so that the voltage blocking capability thereof is reduced. It is also to be noted that the slight declination of the axis 29 shown at 33 results in a many times multiplied edge declination shown at 35.

It is an object of my invention to provide plural junction, double positively beveled semiconductive elements which are more rugged, more uniform in blocking voltage characteristics, easier to fabricate, and obtainable at higher yields as compared with plural junction, double positively beveled semiconductive elements heretofore known to the art.

It is another object of my invention to provide a process for producing positively beveled edges on plural junction semiconductive elements, which process is more easily employable, permits closer replication, and results in higher element yields and more uniform electrical characteristics as compared to processes heretofore employed for the manufacture of double positively beveled semiconductor elements.

It is a specific object of my invention to provide an improved double positively beveled thyristor structure and a novel process for its manufacture.

Figure 2:
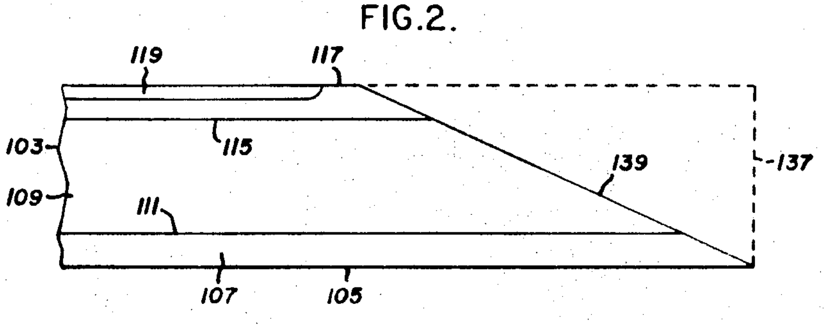
Figure 3:
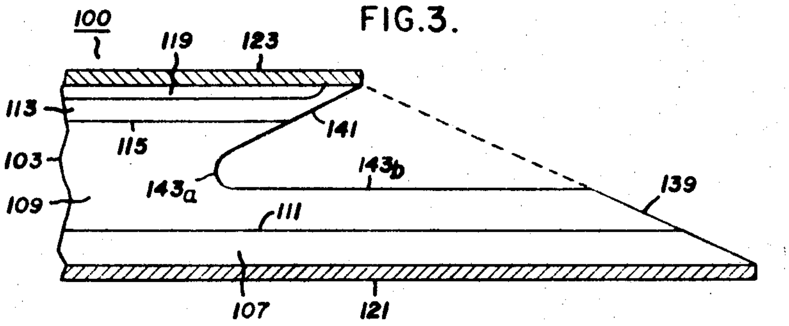

These and other objects of my invention may be better understood by reference to the following detailed description considered in conjunction with drawings, in which FIG. 1 is a sectional view of one edge of a conventional double positively beveled thyristor structure;

FIG. 2 is a sectional view of one edge of a thyristor semiconductive element at an intermediate stage of manufacture according to my invention; and FIG. 3 is a sectional view of one edge of a double positively beveled thyristor structure according to my invention.

In the drawings the dimensions of the semiconductive elements are exaggerated to facilitate illustration. Also, sectioning is omitted from the semiconductive elements in order to avoid excessively cluttering the drawings. For each of the semiconductive elements shown the edge bevel configuration illustrated in cross-section is identical around the entire periphery of the semiconductive element.

In order to fabricate the thyristor structure 100 shown in FIG. 3 a semiconductive element 103 is utilized which is generally similar to semiconductive element 3, except for its edge contour. Features of the semiconductive element 103 corresponding to those of semiconductive element 3 are assigned corresponding reference characters in the 100 series and are not redescribed in detail. Initially the semiconductive element 103 is provided with an edge surface 137 shown in dashed lines in FIG. 2. The edge surface 137 is usually oriented approximately normal to the first and second major surfaces 105 and 117; however, the initial configuration of the edge surface is not critical and may take any one of a variety of convenient forms.

In order to positively bevel the first junction 111 of the semiconductive element 103, which is the reverse voltage blocking junction, a first beveled edge surface 139 is formed around the periphery of the semiconductive element. In the preferred form the first edge surface 139 is configured to describe a frustum and is linear in vertical section. As an alternative the first beveled edge surface could be somewhat curved, preferably convex, in section, if desired. The important point is that the first beveled edge surface traverse the junction 111 at the desired positive bevel angle to achieve the desired voltage blocking characteristics for this junction. The first edge surface may be most conveniently formed by mechanical shaping techniques, such as by mechanically lapping the edge of the semiconductive element or by grit blasting. It is to be noted that where the first edge surface 139 is linear or even convex in curvature as compared to the concave curvature of the beveled edge 25 adjacent the junction 11 the formation of an attenuated edge on the semiconductive element is avoided and hence the edge of the semiconductive element adjacent the first major surface is much less susceptible to damage during edge formation, during subsequent handling in processing, and during subsequent use in a thyristor.

In FIG. 2 it can be seen that while the first edge surface 139 intersects the junction 111 to form a positive bevel angle therewith, it intersects the junction 115 to form a negative bevel angle. Where the first beveled surface is a frustum and traverses the junction 111 at a bevel angle of above about 10°, it actually decreases the voltage blocking capability of the forward voltage blocking junction 115 to a level below that obtainable with a perpendicular edge surface across this junction. As a matter of fact, as a practical matter the first edge surface 139 typically forms a bevel angle with the junctions in the range of from about 10° to 60°, which greatly increases the surface field intensity adjacent the forward voltage blocking junction 115.

To reduce the surface field intensity adjacent the junction 115 and to increase its forward voltage blocking capability even above that obtainable with an edge oriented normal to this junction, I relieve the semiconductive element adjacent this junction to form the second beveled edge surface 141 as shown in FIG. 3. The second beveled edge surface, like the first, typically intersects the junction to form a positive bevel angle of from 10° to 60°. The second beveled edge surface is preferably also configured as a frustum and is linear in vertical section. Like the first edge surface 139 the second beveled edge surface by being linear or convex avoids the formation of an attenuated edge with the adjacent major surface. In fact, it is to be noted that the second beveled edge surface lies entirely inwardly of the tangential extension of the first beveled edge surface. Thus, the edge formed by the second major surface and the second beveled edge surface lies inwardly of the lower edge of the semiconductive element and is thereby protected. A third edge surface comprised of a concave portion **143*a* and an approximately horizontal portion 143*b* connects the inner edges of the first and second beveled edge surfaces. By providing a concave transition surface 143*a* between the surfaces 141 and 143*b* the minimum cross-sectional area of the semiconductive element 103 in a horizontal plane—that is, the cross-sectional area that limits current conduction—is increased significantly. Further, the concave transition surface provides a surface to which it is easier to apply a passivant than if the surfaces 141 and 143*b* were simply linearly extended in FIG. 3** to their point of intersection.

Relief of the semiconductive element after formation of the first beveled edge surface 139 to form the second and third edge surfaces may be accomplished mechanically in any one of several ways. According to a preferred technique the first edge surface is grit blasted with fluid borne abrasive particles from a jet having its angle of impingement approximately coinciding with the angle of intersection between the second beveled edge surface 141 and the junction 115. The grit blast technique forms the concave surface portion **143*a* concurrently with formation of the second beveled edge surface. Instead of employing the grit blasting technique the first beveled edge surface could be relieved to form the second and third edge surfaces using an undercutting die or a wire sawing technique. The shape of the surface portion 143*b* is not particularly critical and could vary considerably from the form shown, particularly where the second bevelled edge is formed by grit blasting. It is preferred, however, that the second beveled edge and the third edge portion 143*b*** be formed to diverge outwardly. This greatly facilitates the association of a passivant with these edge surfaces. This avoids passivating difficulties encountered with deep grooving techniques which have been heretofore considered by those skilled in the art.

A particular advantage of my invention is that a slight misalignment of the semiconductive element or relieving tool in forming the second beveled edge surface produces no great variation in the edge surface or the angle of intersection of the second edge surface with the junction 115. This is in direct contrast to the situation encountered with the bevel configuration shown in FIG. 1. Whereas in the semiconductive element 3 the vertical alignment of the horizontal axis of the parabolic surface 25 is critical to obtaining optimum results, in relieving the semiconductive element 103 the depth of the surface portion **143*b* below the junction 115 can vary considerably without materially affecting the electrical performance of this junction. It is to be further noted that since the second layer 109 is much wider than the first layer 107 or the third and fourth layer 113 and 119 combined, the vertical location of the surface portion 143*b*** within the second layer does not require extremely precise control to be exercised over the relieving step.

After the thyristor 100 has been contoured according to my teachings, it may be edge passivated and/or packaged according to conventional techniques. While my invention is considered to be particularly applicable to thyristors and their fabrication, it is appreciated that my invention may be applied to semiconductor devices generally where it is desired to improve the voltage blocking capabilities of plural junctions. Having described my invention with reference to certain preferred embodiments, it is recognized that still other forms will be readily apparent to those skilled in the art having access to my teachings. It is accordingly intended that the scope of my invention be determined by reference to the following claims.

What I claim and desire to secure by Letters Patent of the United States is:

1. A process for beveling a semiconductive element containing a first layer of a first conductivity type, a second layer of an opposite conductivity type located adjacent the first layer and forming a first junction therewith, and a third layer of the first conductivity type lying adjacent the second layer and forming a second junction therewith, the second layer's width as measured thereacross between the first and second junctions being greater than the corresponding width of either of the first and third layers, the second layer exhibiting a higher resitivity than either of the first and third layers, comprising forming a first edge surface peripherally encompassing the semiconductive element, intersecting the first junction at an acute angle to form a positive bevel angle therewith, and extending transversely across the second layer to intersect the second junction to form a negative bevel angle therewith, and relieving a portion of the semiconductive element along the first edge surface adjacent the second junction to form a second edge surface positively beveled across the second junction and lying entirely inwardly of the first edge surface, and also to form a third edge surface extending inwardly from said first edge surface between said first and second junctions to join with said second edge surface, said third edge surface comprising a concave portion and a horizontal portion, said concave portion extending from said second edge surface to said horizontal portion, said horizontal portion extending generally parallel to said junctions from said concave portion to said first edge surface, said second and third edge surfaces diverging outwardly from the junction thereof so as to produce a relatively wide divergence.

2. A process according to claim 1 in which the portion of the semiconductive element adjacent the second junction is relieved by grit blasting.

3. A process according to claim 1 in which each of said edge surfaces are formed by grit blasting.

4. A process for beveling a semiconductive element containing a first layer of a first conductivity type, a second layer of an opposite conductivity type located adjacent the first layer and forming a first junction therewith, and a third layer of the first conductivity type lying adjacent the second layer and forming a second junction therewith, the second layer's width as measured thereacross between the first and second junctions being greater than the corresponding width of either the first and third layers, the second layer exhibiting a higher resistivity than either of the first and third layers, comprising forming a first frustum surface peripherally encompassing the semiconductive element intersecting the first junction at an acute angle to form a positive bevel angle therewith and extending transversely across the second layer to intersect the second junction to form a negative bevel angle therewith, and relieving a portion of the semiconductive element along the first frustum surface adjacent the second junction to form a second frustum surface positively beveled across the second junction and lying entirely inwardly of the first frustum surface, and also to form a third surface extending inwardly from said first frustum surface between said first and second junctions to join with said second frustum surface, said third surface comprising a concave portion and a horizontal portion, said concave portion extending from said second frustum surface to said horizontal portion, said horizontal portion extending substantially parallel to said junctions from said concave portion to said first frustum surface, said second frustum surface and said third surface diverging outwardly from the junction thereof so as to produce a relatively wide divergence.

* * * * *